United States Patent
Yao et al.

(10) Patent No.: US 6,787,803 B1
(45) Date of Patent: Sep. 7, 2004

(54) TEST PATTERNS FOR MEASUREMENT OF LOW-K DIELECTRIC CRACKING THRESHOLDS

(75) Inventors: Chih-Hsiang Yao, Hsin-Chu (TW); Tai-Chun Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/602,970

(22) Filed: Jun. 24, 2003

(51) Int. Cl.[7] .............................................. H01L 21/66
(52) U.S. Cl. ...................... 257/48; 257/414; 257/467; 257/528; 257/633; 257/798; 438/14; 438/15; 438/404
(58) Field of Search .......................... 438/14–15, 404; 257/48, 415, 417, 469, 528, 632–635, 798

(56) References Cited

U.S. PATENT DOCUMENTS

| | | | | |
|---|---|---|---|---|
| 5,637,186 A | * | 6/1997 | Liu et al. ...................... | 438/14 |
| 5,981,302 A | * | 11/1999 | Alswede et al. ............... | 438/15 |
| 6,028,324 A | * | 2/2000 | Su et al. ........................ | 257/48 |
| 6,329,671 B1 | * | 12/2001 | Tamaki et al. ................. | 257/48 |
| 6,472,236 B1 | * | 10/2002 | Wang et al. ................... | 438/14 |
| 6,605,868 B2 | * | 8/2003 | Ishiwata et al. ............. | 257/703 |
| 6,613,592 B1 | * | 9/2003 | Chen et al. .................... | 438/14 |
| 6,680,484 B1 | * | 1/2004 | Young .......................... | 257/48 |
| 2002/0004288 A1 | * | 1/2002 | Nishiyama ................... | 438/464 |
| 2002/0167071 A1 | * | 11/2002 | Wang .......................... | 257/620 |
| 2004/0048402 A1 | * | 3/2004 | Ishii ............................ | 438/14 |

FOREIGN PATENT DOCUMENTS

| | | | | | |
|---|---|---|---|---|---|
| TW | | 522539 A | * | 3/2003 | ........... H01L/21/66 |

* cited by examiner

*Primary Examiner*—Caridad Everhart
*Assistant Examiner*—Renzo Rocchegiani
(74) *Attorney, Agent, or Firm*—Slater & Matsil, L.L.P.

(57) ABSTRACT

The present invention provides two or more test structures/substructures (100) that are used in a test pattern (500, 600, 700, 800) to determine a cracking threshold for a dielectric material (104) on a substrate. Each test structure/substructure (100) includes two metal structures (102) separated by the dielectric material (104) having a width (G) which is different for each test structure/substructure (100). The cracking threshold will be approximately equal to the largest width (G) of dielectric material (104) that is cracked after processing. The present invention also provides a method for determining the cracking threshold for the dielectric material (104). Two or more test structures (100) are formed on the substrate (402) followed by a determination of whether the dielectric material (104) between the two metal structures (102) for each test structure (100) has cracked during processing (404).

29 Claims, 3 Drawing Sheets

TEST PATTERNS FOR MEASUREMENT OF LOW-K DIELECTRIC CRACKING THRESHOLDS

TECHNICAL FIELD

The present invention relates in general to the field of fabricating semiconductor devices, and more particularly to a test pattern for measurement of low-k dielectric cracking thresholds.

BACKGROUND

As integrated circuit device dimensions shrink, low-k dielectrics are commonly adopted as the inter-metal dielectrics to lower the RC delay so as to optimize their electrical performance. There is, however, a trade off. The gain achieved by decreasing the K-value of the dielectric is made at the expense of decreasing the mechanical properties of the low-k dielectrics. One common material property, namely, the cracking threshold, is a good index indicating the possibility and/or the limit of the low-k dielectric suffering fatal cracks during the silicon processing. Currently, the cracking threshold is measured on blanket wafers or through a random search for cracking sites among the existing patterns. There are no known dedicated patterns that provide systematic and practical measurement of the cracking threshold for low-k dielectric materials on the pattern wafers.

SUMMARY OF THE INVENTION

The present invention provides a systematic and practical structure and method to measure the cracking threshold of the low-k dielectrics in pattern wafers. As a result, the present invention provides prompt and easy low-k inter-metal dielectric (IMD) screening for nano-scale integrated circuit (IC) manufacturing using many newly invented materials. The present invention can be implemented on one or more layers of experimental wafers to develop design parameters for production wafers or on production wafers to monitor the production baseline processes.

More specifically, the present invention provides a test structure/substructure that is used as part of a test pattern for determining a cracking threshold for a dielectric material on a substrate. The test pattern includes two or more test structures disposed on the substrate. Each test structure/substructure includes two metal structures separated by the dielectric material having a width which is different for each test structure. The cracking threshold will be approximately equal to the largest width of dielectric material that is cracked after processing.

The present invention also provides a method for determining a cracking threshold for a dielectric material. Two or more test structures are formed on the substrate. Each test structure includes two metal structures separated by the dielectric material having a width which is different for each test structure. A determination of whether the dielectric material between the two metal structures for each test structure has cracked during processing is then made. The cracking threshold is approximately equal to the largest width of dielectric material that is cracked. The cracking threshold can be measured by electrically probing the two metal structures in each test structure to measure a leakage current across the with of the dielectric material for each test structure. The cracking threshold can also be measured by optically inspecting the width of the dielectric material for each test structure.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF ILLUSTRATIVE EMBODIMENTS

While the production and application of various embodiments of the present invention are discussed in detail below in relation to low-k dielectrics and inter-metal dielectrics (IMD), it should be appreciated that the present invention provides many applicable inventive concepts that may be embodied in a wide variety of specific contexts. The specific embodiments discussed herein are merely illustrative of specific ways to make and use the invention and do not delimit the scope of the invention.

The present invention provides a systematic and practical structure and method to measure the cracking threshold of the low-k dielectrics in pattern wafers. As a result, the present invention provides prompt and easy low-k inter-metal dielectric (IMD) screening for nano-scale integrated circuit (IC) manufacturing using many newly invented materials. The present invention can be implemented on one or more layers of experimental wafers to develop design parameters for production wafers or on production wafers to monitor the production baseline processes.

Figure 1:
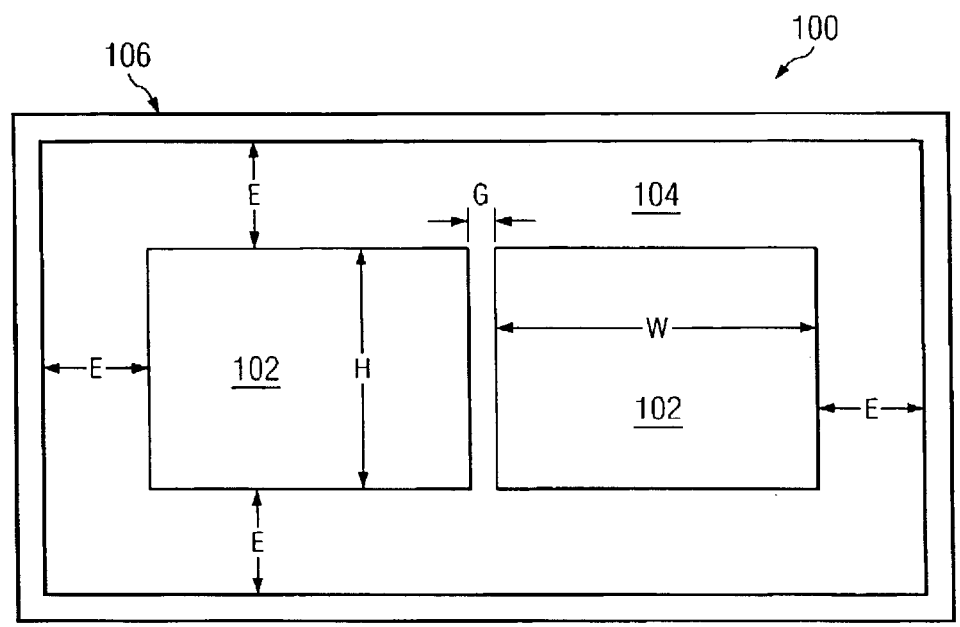
FIG. 1 is a diagram of a test structure/substructure in accordance with one embodiment of the present invention.

Now referring to FIG. 1, a diagram of a test structure/substructure 100 in accordance with one embodiment of the present invention is shown. The test structure/substructure 100 is used as part of a test pattern for determining a cracking threshold for a dielectric material on a substrate. The test pattern includes two or more test structures disposed on the substrate. Each test structure/substructure 100 includes two metal structures 102, typically copper having dimensions H and W. Other metals and conductors can be employed such as aluminum and aluminum alloys, conductive polysilicon, other metal alloys, and the like. The metal structures are separated by the dielectric material 104 having a width G, which is different for each test structure. A sealing ring 106 is disposed around the test structure 100 to isolate the test structure/substructure 100 from outside stresses that could damage the test structure/substructure 100. These stresses include horizontal shear stress. The sealing ring serves as a stop to cracks that originate outside the ring and that would otherwise propagate to within the ring during thermal cycling. The sealing ring is preferably formed from the same metal material, e.g., copper, as the metal feature(s) within the ring and is preferably formed using the same fabrication process. The cracking threshold of the silicon baseline process is approximately equal to the largest width G of dielectric material 104 that is cracked after processing.

The mechanism by which different sized metal structures cause different levels of cracking is believed to be an artifact of thermal expansion mismatch. The metal structures will have a different thermal expansion coefficient than the dielectric materials. The deformation/displacement of the metal structure and of the dielectric is a function of the respective widths. By varying the width of the features, resulting in various deformation and displacements, and hence varying the stress placed on the low-k material, the cracking threshold can be determined.

Typically, the width G of the dielectric material 104 is chosen within a range of 0.05 and 1.0 $\mu$m and the separation E between the sealing ring 106 and the two metal structures 102 exceeds the maximum width G being tested. Moreover, the width G of the dielectric material 104 for the two or more test structures 100 are chosen to differ by approximately 0.05 $\mu$m. Note that the test structures/substructures 100 may be disposed on more than one layer of the silicon-on-insulator (SOI) structure.

Figure 3:
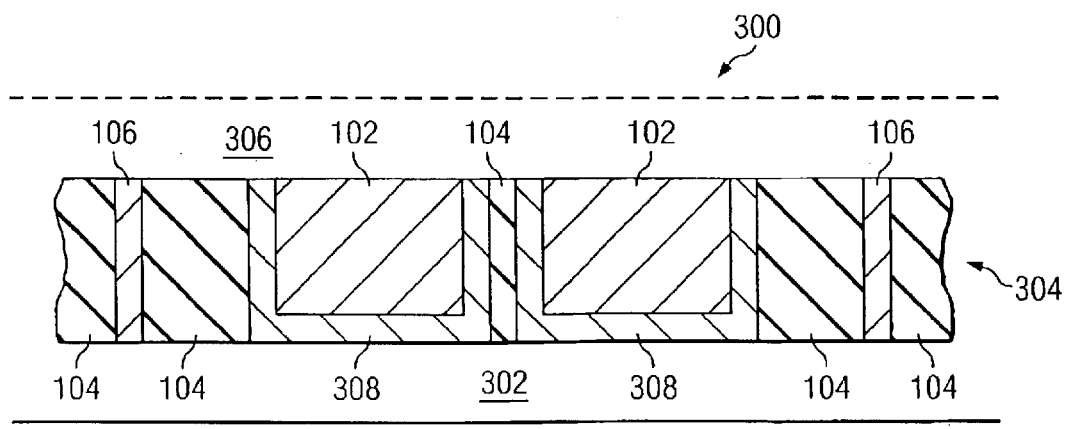
FIG. 3 is a cross-sectional view of another test structure/substructure in accordance with the present invention.

The dielectric material 104 can be a low-k dielectric material, such as polymide, silicon oxycarbide, hydrogen silsesquioxane, methyl silsesquioxane, bezocyclobutene, fluorinated glass, fluorinated aromatic ether, inter-penetrated SOG, SILK™, Nanoglass™, Coral™, Black Diamond™ and combinations thereof. The metal structures 102 can be a damascene structure, multi-layer damascene structure, modified damascene structure, etc. As illustrated in FIG. 3, a barrier layer may surround each metal structure 102 to reduce migration of the metal into the dielectric material 104 during processing. In some embodiments, dielectric material 104 can be a multi-layer dielectric structure formed of one or more different dielectric materials.

Figure 5:
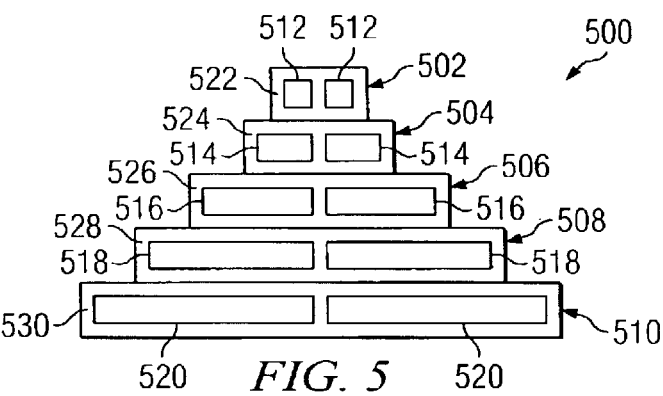
FIG. 5 is a diagram of a test structure in accordance with one embodiment of the present invention.
Figure 6:
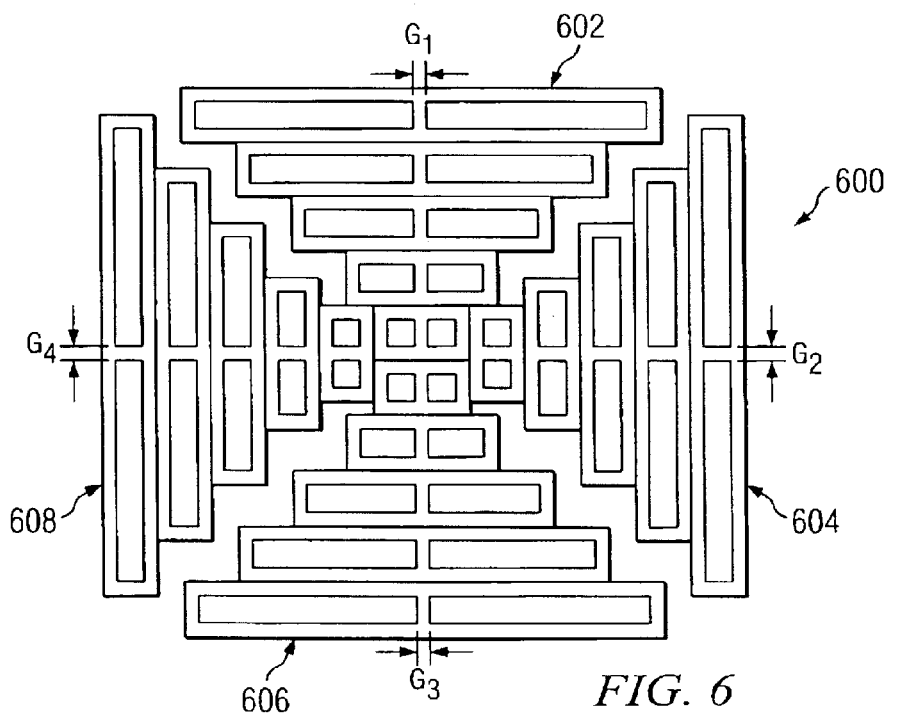
FIG. 6 is a diagram of a test pattern in accordance with another embodiment of the present invention.
Figure 7:
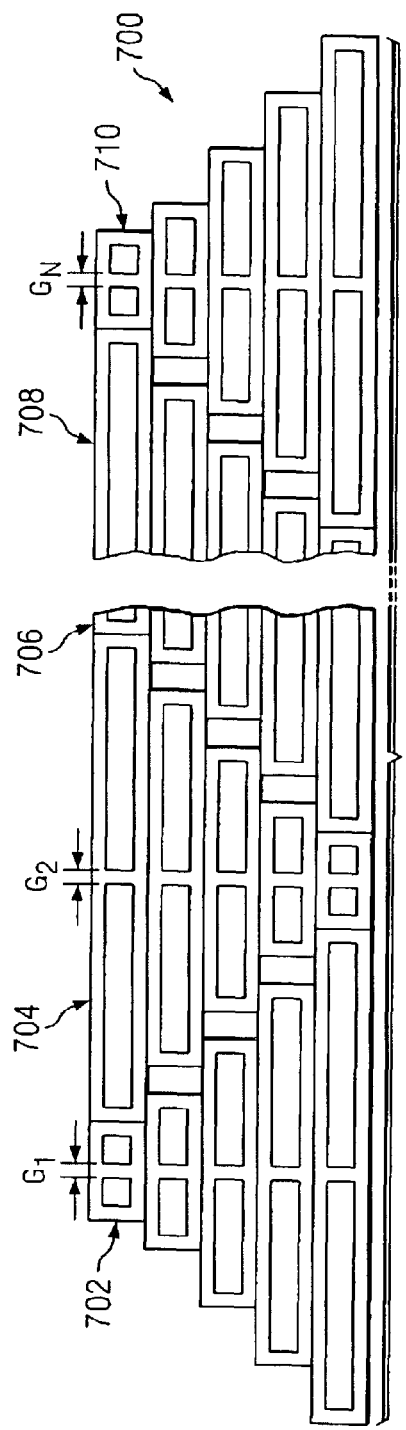
FIG. 7 is a diagram of a test pattern in accordance with another embodiment of the present invention.
Figure 8:
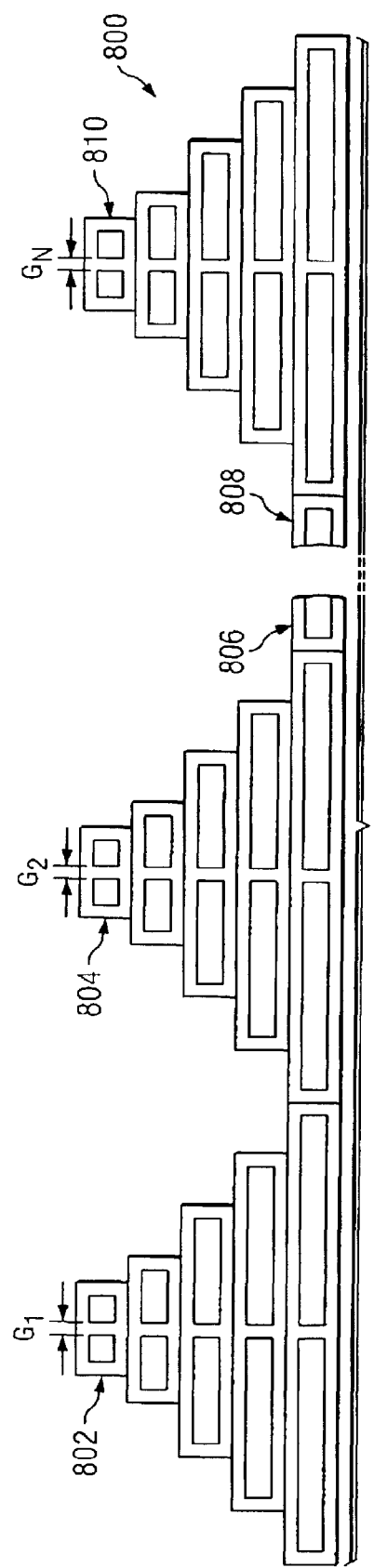
FIG. 8 is a diagram of a test pattern in accordance with another embodiment of the present invention.

Depending on the implementation, each test structure may include two or more test substructures 100. Each test substructure 100 includes two metal structures 102 having a first width W, which is different for each test substructure 100. The two metal structures 102 are separated by the dielectric material 104 having a second width G, which is substantially constant for each test substructure 100 and different for each test structure. Typically, the variation of the first width W, from smallest to largest, is 500% or more and the second width G, from smallest to largest, is 700% or more. For example, the first width W is selected from a range of 1 to 30 $\mu$m and the second width G is selected from a range of 0.05 to 1.0 $\mu$m. The two or more test substructures 100 can be arranged in a pyramid pattern to form a test structure 500 as illustrated in FIG. 5. The test structures 500 can then be arranged in a block pattern as shown in FIG. 6, adjacent and inverted to one another as shown in FIG. 7, or adjacent to one another as shown in FIG. 8.

Figure 2:
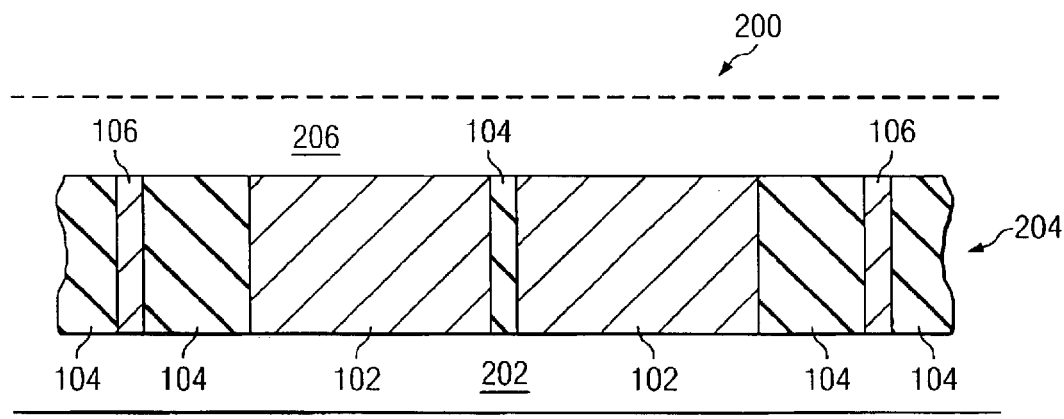
FIG. 2 is a cross-sectional view of the test structure/substructure of FIG. 1 in accordance with one embodiment of the present invention.

Referring now to FIG. 2, a cross-sectional view of the test structure/substructure 100 of FIG. 1 is shown in accordance with one embodiment of the present invention. The lower layer 202 can be the semiconductor substrate or any processing layer preceding the test structure/substructure layer 204. While the preferred embodiments are described with reference to a semiconductor substrate, the teachings of the present invention apply equally to silicon-on-insulator (SOI) substrates, and other substrates as well. The upper layer 206 is optional and may contain another test structure/substructure. The test structure/substructure layer 204 includes the metal structures 102, dielectric material 104 and sealing ring 106. The test structure/substructure 204 can be created using standard processing techniques, such as a standard trench first dual damascene IC fabrication process.

Now referring to FIG. 3, a cross-sectional view of another test structure/substructure 300 in accordance with the present invention is shown. The lower layer 302 can be the semiconductor substrate or any processing layer preceding the test structure/substructure layer 304. The upper layer 306 is optional and may contain another test structure/substructure. The test structure/substructure layer 304 includes the metal structures 102, dielectric material 104, sealing ring 106 and barrier layer 308. The test structure/substructure 304 can be created using standard processing techniques.

Figure 4:
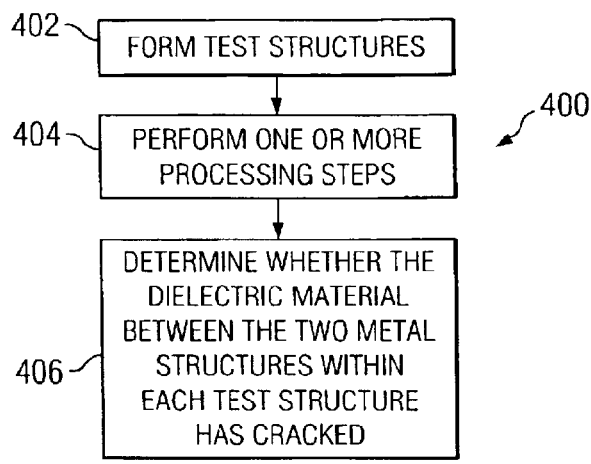
FIG. 4 is a flow chart illustrating the method for determining a cracking threshold for a dielectric material in accordance with the present invention.

Referring now to FIG. 4, a flow chart illustrating the method 400 for determining a cracking threshold for a dielectric material in accordance with the present invention is shown. Two or more test structures are formed on the substrate in block 402. Each test structure includes two metal structures separated by the dielectric material having a width which is different for each test structure as described above in reference to FIG. 1. One or more processing steps are then performed in block 404. These may include post ECP annealing, post CMP alloy formation, in-line baking, and various thermal cycling, and current cycling processes associated with completion of the same or subsequent layers. A determination of whether the dielectric material between the two metal structures for each test structure has cracked during processing is made in block 406. The cracking threshold is approximately equal to the largest width of dielectric material that is cracked. The cracking threshold can be measured by electrically probing the two metal structures in each test structure to measure a leakage current across the width of the dielectric material for each test structure. The cracking threshold can also be measured by optically inspecting the width of the dielectric material for each test structure.

Now referring to FIG. 5, a diagram of a test structure 500 in accordance with one embodiment of the present invention is shown. The test structure 500 shown includes five test substructures 502, 504, 506, 508 and 510 as described in reference to FIG. 1. A group of test structures 500 can be arranged together to form a test pattern as illustrated in FIGS. 6, 7 and 8. Other test patterns may be used depending on the circumstances. As shown, the first width W for the metal structures 512, 514, 516, 518 and 520 varies; whereas, the dielectric materials 522, 524, 526, 528 and 530 have a second width G, sealing ring 532, 534, 536, 538 and 540 and dimensions E and H are constant for each test substructure 502, 504, 506, 508 and 510. Note that dielectric material 522, 524, 526, 528 and 530 are regions of a single dielectric layer. Moreover, the dielectric material 522, 524, 526, 528 and 530 can be a combination of several layers of one or more different dielectric materials.

Referring now to FIG. 6, a diagram of a test pattern 600 in accordance with another embodiment of the present invention is shown. The test pattern 600 includes four test structures 602, 604, 606 and 608 arranged in a block pattern. The test structures 602, 604, 606 and 608 are similar to test structure 500 described in reference to FIG. 5, wherein the first width W for the metal structures vary among the test substructures within each test structure 602, 604, 606 and 608, and the second width G is constant within each test structure 602, 604, 606 and 608, but varies between the test structures 602, 604, 606 and 608. Specifically, the second width G for test structures 602, 604, 606 and 608 are $G_1$, $G_2$, $G_3$ and $G_4$, respectively.

Now referring to FIG. 7, a diagram of a test pattern 700 in accordance with another embodiment of the present invention is shown. The test pattern 700 includes five or more test structures 702, 704, 706, 708 and 710 that are adjacent and inverted to one another. The test structures 702, 704, 706, 708 and 710 are similar to test structure 500 described in reference to FIG. 5, wherein the first width W for the metal structures vary among the test substructures within each test structure 702, 704, 706, 708 and 710, and the second width G is constant within each test structure 702, 704, 706, 708 and 710, but varies between the test structures 702, 704, 706, 708 and 710. Specifically, the second width G for test structures 702, 704, 706, 708 and 710 are $G_1$, $G_2$, ..., and $G_N$, respectively.

Referring now to FIG. 8, a diagram of a test pattern 800 in accordance with another embodiment of the present invention is shown. The test pattern 800 includes four test structures 802, 804, 806, 808 and 810 that are adjacent to one another. The test structures 802, 804, 806, 808 and 810 are similar to test structure 500 described in reference to FIG. 5, wherein the first width W for the metal structures vary among the test substructures within each test structure 802, 804, 806, 808 and 810, and the second width G is constant within each test structure 802, 804, 806, 808 and 810, but varies between the test structures 802, 804, 806 and 808. Specifically, the second width G for test structures 802, 804, 806, 808 and 810 are $G_1$, $G_2$, ..., and $G_N$, respectively.

The following table lists the dimensions for the test substructures in accordance with one implementation of the present invention. The test pattern illustrated includes twelve test structures with each test structure having five test substructures.

| Test Pattern Structure No. | Substructure No. | Dimensions (μm) E | G | H | W |
|---|---|---|---|---|---|
| 1 | 1 | 0.9 | 0.10 | 3 | 3 |
|  | 2 | 0.9 | 0.10 | 3 | 5 |
|  | 3 | 0.9 | 0.10 | 3 | 10 |
|  | 4 | 0.9 | 0.10 | 3 | 15 |
|  | 5 | 0.9 | 0.10 | 3 | 20 |
| 2 | 1 | 0.9 | 0.15 | 3 | 3 |
|  | 2 | 0.9 | 0.15 | 3 | 5 |
|  | 3 | 0.9 | 0.15 | 3 | 10 |
|  | 4 | 0.9 | 0.15 | 3 | 15 |
|  | 5 | 0.9 | 0.15 | 3 | 20 |
| 3 | 1 | 0.9 | 0.20 | 3 | 3 |
|  | 2 | 0.9 | 0.20 | 3 | 5 |
|  | 3 | 0.9 | 0.20 | 3 | 10 |
|  | 4 | 0.9 | 0.20 | 3 | 15 |
|  | 5 | 0.9 | 0.20 | 3 | 20 |
| 4 | 1 | 0.9 | 0.25 | 3 | 3 |
|  | 2 | 0.9 | 0.25 | 3 | 5 |
|  | 3 | 0.9 | 0.25 | 3 | 10 |
|  | 4 | 0.9 | 0.25 | 3 | 15 |
|  | 5 | 0.9 | 0.25 | 3 | 20 |
| 5 | 1 | 0.9 | 0.30 | 3 | 3 |
|  | 2 | 0.9 | 0.30 | 3 | 5 |
|  | 3 | 0.9 | 0.30 | 3 | 10 |
|  | 4 | 0.9 | 0.30 | 3 | 15 |
|  | 5 | 0.9 | 0.30 | 3 | 20 |
| 6 | 1 | 0.9 | 0.35 | 3 | 3 |
|  | 2 | 0.9 | 0.35 | 3 | 5 |
|  | 3 | 0.9 | 0.35 | 3 | 10 |
|  | 4 | 0.9 | 0.35 | 3 | 15 |
|  | 5 | 0.9 | 0.35 | 3 | 20 |
| 7 | 1 | 0.9 | 0.40 | 3 | 3 |
|  | 2 | 0.9 | 0.40 | 3 | 5 |
|  | 3 | 0.9 | 0.40 | 3 | 10 |
|  | 4 | 0.9 | 0.40 | 3 | 15 |
|  | 5 | 0.9 | 0.40 | 3 | 20 |
| 8 | 1 | 0.9 | 0.45 | 3 | 3 |
|  | 2 | 0.9 | 0.45 | 3 | 5 |
|  | 3 | 0.9 | 0.45 | 3 | 10 |
|  | 4 | 0.9 | 0.45 | 3 | 15 |
|  | 5 | 0.9 | 0.45 | 3 | 20 |
| 9 | 1 | 0.9 | 0.50 | 3 | 3 |
|  | 2 | 0.9 | 0.50 | 3 | 5 |
|  | 3 | 0.9 | 0.50 | 3 | 10 |
|  | 4 | 0.9 | 0.50 | 3 | 15 |
|  | 5 | 0.9 | 0.50 | 3 | 20 |
| 10 | 1 | 0.9 | 0.60 | 3 | 3 |
|  | 2 | 0.9 | 0.60 | 3 | 5 |
|  | 3 | 0.9 | 0.60 | 3 | 10 |
|  | 4 | 0.9 | 0.60 | 3 | 15 |
|  | 5 | 0.9 | 0.60 | 3 | 20 |
| 11 | 1 | 0.9 | 0.70 | 3 | 3 |
|  | 2 | 0.9 | 0.70 | 3 | 5 |
|  | 3 | 0.9 | 0.70 | 3 | 10 |
|  | 4 | 0.9 | 0.70 | 3 | 15 |
|  | 5 | 0.9 | 0.70 | 3 | 20 |
| 12 | 1 | 0.9 | 0.80 | 3 | 3 |
|  | 2 | 0.9 | 0.80 | 3 | 5 |
|  | 3 | 0.9 | 0.80 | 3 | 10 |
|  | 4 | 0.9 | 0.80 | 3 | 15 |
|  | 5 | 0.9 | 0.80 | 3 | 20 |

Accordingly, the first W width for the first test substructure, second test substructure, third test substructure, fourth test substructure and fifth test substructure is approximately 3, 5, 10, 15 and 20 μm, respectively. The second width G for the first test structure, second test structure, third test structure, fourth test structure, fifth test structure, sixth test structure, seventh test structure, eighth test structure, ninth test structure, tenth test structure, eleventh test structure and twelfth test structure is approximately 0.1, 0.2, 0.25, 0.3, 0.4, 0.5, 0.55, 0.6, 0.65, 0.7, and 0.8 μm, respectively.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for determining a cracking threshold for a dielectric material on a substrate comprising the steps of:

forming two or more test structures on the substrate, each test structure comprising two metal structures separated by the dielectric material having a width which is different for each test structure; and determining whether the dielectric material between the two metal structures for each test structure has cracked during processing, the cracking threshold being approximately equal to the largest width of dielectric material that is cracked.

2. The method as recited in claim 1, wherein the step of determining whether the dielectric material between the two metal structures for each test structure has cracked during processing is performed by electrically probing the two metal structures in each test structure to measure a leakage current across the width of the dielectric material for each test structure.

3. The method as recited in claim 1, wherein the step of determining whether the dielectric material between the two metal structures for each test structure has cracked during processing is performed by optically inspecting the width of the dielectric material for each test structure.

4. The method as recited in claim 1, wherein the dielectric material is a low-k dielectric material chosen from the group consisting of polymide, silicon oxycarbide, hydrogen silsesquioxane, methyl silsesquioxane, bezocyclobutene, fluorinated glass, fluorinated aromatic ether, and inter-penetrated spin-on glass.

5. A test pattern for determining a cracking threshold for a dielectric material on a substrate comprising:

two or more test structures disposed on the substrate;

each test structure comprising two metal structures separated by the dielectric material having a width which is different for each test structure; and wherein the cracking threshold is approximately equal to the largest width of dielectric material that is cracked after processing.

6. The test pattern as recited in claim 5, wherein the dielectric material is a low-k dielectric material chosen from the group consisting of polymide, silicon oxycarbide, hydrogen silsesquioxane, methyl silsesquioxane, bezocyclobutene, fluorinated glass, fluorinated aromatic ether, and inter-penetrated spin-on glass.

7. The test pattern as recited in claim 5, wherein the two metal structures are copper.

8. The test pattern as recited in claim 5, further comprising a barrier layer surrounding each metal structure.

9. The test pattern as recited in claim 5, wherein each metal structure comprises a damascene structure containing a metal.

10. The test pattern as recited in claim 5, wherein the test structures are disposed on more than one layer of a silicon-on-insulator structure.

11. The test pattern as recited in claim 5, wherein the width is within a range of 0.05 and 1.0 $\mu$m.

12. The test pattern as recited in claim 5, wherein the width of the dielectric material for the two or more test structures differs by approximately 0.05 $\mu$m.

13. The test pattern as recited in claim 5, further comprising a sealing ring disposed around each test structure.

14. The test pattern as recited in claim 13, wherein the separation between the sealing ring and the two metal structures exceeds the width.

15. The test pattern as recited in claim 5, wherein each test structure comprises:

two or more test substructures; and each test substructure includes two metal structures having a first width which is different for each test substructure, the two metal structures separated by the dielectric material having a second width which is substantially constant for each test substructure and different for each test structure.

16. The test pattern as recited in claim 15, wherein the first width is selected from a range of 1 to 30 $\mu$pm and the second width is selected from a range of 0.05 to 1.0 $\mu$m.

17. The test pattern as recited in claim 15, wherein the two or more test substructures are arranged in a pyramid pattern.

18. The test pattern as recited in claim 15, wherein:

the first width for the first test substructure, second test substructure, third test substructure, fourth test substructure and fifth test substructure is approximately 3, 5, 10, 15 and 20 $\mu$m, respectively; and the second width for the first test structure, second test structure, third test structure; fourth test structure, fifth test structure, sixth test structure, seventh test structure, eighth test structure, ninth test structure, tenth test structure, eleventh test structure and twelfth test structure is approximately 0.1, 0.2, 0.25, 0.3, 0.4, 0.45, 0.5, 0.55, 0.6, 0.65, 0.7, and 0.8 $\mu$m, respectively.

19. A test pattern comprising:

two or more test structures disposed on a substrate;

each test structure includes two or more test substructures; and each test substructure comprising a sealing ring, two metal structures having a first width which is different for each test substructure, and a dielectric material disposed between each metal structure and the sealing ring and between the two metal structures, the dielectric material between the two metal structures having a second width which is substantially constant for each test substructure and different for each test structure.

20. The test pattern as recited in claim 19, wherein the dielectric material is a low-k dielectric material chosen from the group consisting of polymide, silicon oxycarbide, hydrogen silsesquioxane, methyl silsesquioxane, bezocyclobutene, fluorinated glass, fluorinated aromatic ether, and inter-penetrated spin-on glass.

21. The test pattern as recited in claim 19, wherein the two metal structures are copper.

22. The test pattern as recited in claim 19, further comprising a barrier layer surrounding each metal structure.

23. The test pattern as recited in claim 19, wherein each metal structure comprises a damascene structure containing a metal.

24. The test pattern as recited in claim 19, wherein the test structures are disposed on more than one layer of a silicon-on-insulator structure.

25. The test pattern as recited in claim 19, wherein the first width is selected from a range of 1 to 30 $\mu$m and the second width is selected from a range of 0.05 to 1.0 $\mu$m.

26. The test pattern as recited in claim 19, wherein the second width of the dielectric material for the two or more test structures differs by approximately 0.05 $\mu$m.

27. The test pattern as recited in claim 19, wherein the separation between the sealing ring and the two metal structures exceeds the second width.

28. The test pattern as recited in claim 19, wherein the two or more test substructures are arranged in a pyramid pattern.

29. The test pattern as recited in claim 19, wherein:

the first width for the first test substructure, second test substructure, third test substructure, fourth test substructure and fifth test substructure is approximately 3, 5, 10, 15 and 20 $\mu$m, respectively; and the second width for the first test structure, second test structure, third test structure, fourth test structure, fifth test structure, sixth test structure, seventh test structure, eighth test structure, ninth test structure, tenth test structure, eleventh test structure and twelfth test structure is approximately 0.1, 0.2, 0.25, 0.3, 0.4, 0.45, 0.5, 0.55, 0.6, 0.65, 0.7, and 0.8 $\mu$m, respectively.

* * * * *